(12) United States Patent
Norholm et al.

(10) Patent No.: US 9,240,811 B2
(45) Date of Patent: Jan. 19, 2016

(54) SWITCHED DUPLEXER FRONT END

(71) Applicants: Niels O. Norholm, Nibe (DK); Feridoon Jalili, Gistrup (DK)

(72) Inventors: Niels O. Norholm, Nibe (DK); Feridoon Jalili, Gistrup (DK)

(73) Assignee: Intel Deutschland GmbH, Neubiberg (DE)

( * ) Notice: Subject to any disclaimer, the term of this patent is extended or adjusted under 35 U.S.C. 154(b) by 342 days.

(21) Appl. No.: 13/658,135

(22) Filed: Oct. 23, 2012

(65) Prior Publication Data

US 2014/0112213 A1  Apr. 24, 2014

(51) Int. Cl.
| | |
|---|---|
| *H03H 7/01* | (2006.01) |
| *H04B 1/00* | (2006.01) |
| *H04B 1/56* | (2006.01) |

(52) U.S. Cl.
CPC .............. *H04B 1/0057* (2013.01); *H04B 1/006* (2013.01); *H04B 1/56* (2013.01); *H03H 7/0115* (2013.01); *H03H 7/0153* (2013.01); *H03H 7/1758* (2013.01)

(58) Field of Classification Search
USPC ........................................................ 370/277
See application file for complete search history.

(56) References Cited

U.S. PATENT DOCUMENTS

| 6,249,687 | B1 | 6/2001 | Thomsen et al. | |
|---|---|---|---|---|
| 7,729,724 | B2 | 6/2010 | Rofougaran et al. | |
| 2002/0090974 | A1 | 7/2002 | Hagn | |
| 2011/0279193 | A1 | 11/2011 | Furutani | |
| 2012/0238224 | A1* | 9/2012 | Iwai et al. | 455/91 |
| 2013/0063223 | A1* | 3/2013 | See et al. | 333/32 |
| 2013/0122831 | A1* | 5/2013 | Desclos et al. | 455/78 |
| 2013/0241666 | A1* | 9/2013 | Granger-Jones et al. | 333/101 |
| 2013/0250819 | A1* | 9/2013 | Khlat et al. | 370/278 |
| 2014/0073268 | A1* | 3/2014 | Taniuchi et al. | 455/83 |

FOREIGN PATENT DOCUMENTS

| CN | 102204100 A | 9/2011 |
|---|---|---|
| CN | 102510270 A | 6/2012 |
| EP | 2501050 A2 | 9/2012 |

OTHER PUBLICATIONS

English traslation of a German Office Action dated Jan. 27, 2015 for co-pending German Application No. 10 2013 111 521.7.

* cited by examiner

*Primary Examiner* — Michael Thier
*Assistant Examiner* — Yaotang Wang
(74) *Attorney, Agent, or Firm* — Eschweiler & Associates, LLC

(57) ABSTRACT

The disclosed invention relates to a transceiver system having a bypass signal path that enables low power consumption. The transceiver system has a plurality of signal paths respectively having a filtering element with a stop band and with a pass band. An antenna switching module (ASM) has a plurality of RF ports and a plurality of switching elements. Respective RF ports are connected to a separate one of the plurality of switching elements that selectively connect the RF port to an antenna port of the ASM. A control unit generates control signals that operate the plurality of switching elements to selectively connect the plurality of signal paths to the antenna port. A filtering response at the antenna port is equal to a combination of the filtering responses of filtering elements within the connected signal paths.

20 Claims, 9 Drawing Sheets

| Band | S1 | S2 | S3 | S4 |
|---|---|---|---|---|
| Band 7 | 1 | 0 | 0 | 0 |
| Band 3 | 0 | 1 | 0 | 0 |
| Band 20 | 0 | 0 | 1 | 0 |
| Band 5 | 0 | 0 | 0 | 1 |
| (C/A 7+3) | 1 | 1 | 0 | 0 |
| (C/A 7+5) | 1 | 0 | 0 | 1 |
| (C/A 7+20) | 1 | 0 | 1 | 0 |

618

| Band | S1 | S2 |
|---|---|---|
| Band 1 | 1 | 0 |
| Band 3 | 0 | 1 |
| Band 4/10 | 1 | 1 | m3
freq=2.110GHz
S(6,6)=0.775 / -55.867
impedance = Z0 * (0.547 - j1.755)

m4
freq=2.170GHz
S(6,6)=0.770 / -63.269
impedance = Z0 * (0.452 - j1.528)

m10
freq=1.710GHz
S(6,6)=0.081 / -88.215
impedance = Z0 * (0.992 - j0.161)

m11
freq=1.755GHz
S(6,6)=0.117 / 153.958
impedance = Z0 * (0.805 + j0.084)

freq (1.5GHz to 2.5GHz)

(12) United States Patent
US 9,240,811 B2

SWITCHED DUPLEXER FRONT END

BACKGROUND

Transceivers are widely used in many wireless communication devices (e.g., cell phones, wireless sensors, PDAs, etc.). As the number of users and functionality of mobile communication devices increases, the need for more bandwidth to wirelessly transmit signals increases. To assuage this need for increased bandwidth, modern communication systems offer a plurality of frequency bands over which data can be transmitted. For example, in LTE (Long Term Evolution) systems there are 43 frequency bands over which data can be transmitted (i.e., 32 frequency bands with distinct uplink and downlink frequencies for FDD and 11 frequency bands for TDD).

To utilize the different frequency bands, modern mobile communication devices comprise transceivers that are configured to operate over multiple frequency bands. Transceivers that operate over multiple frequency bands can increase performance of mobile communication devices by increasing the bandwidth over which data can be transmitted and/or received through aggregation of separate frequency bands.

DETAILED DESCRIPTION

Figure 1:
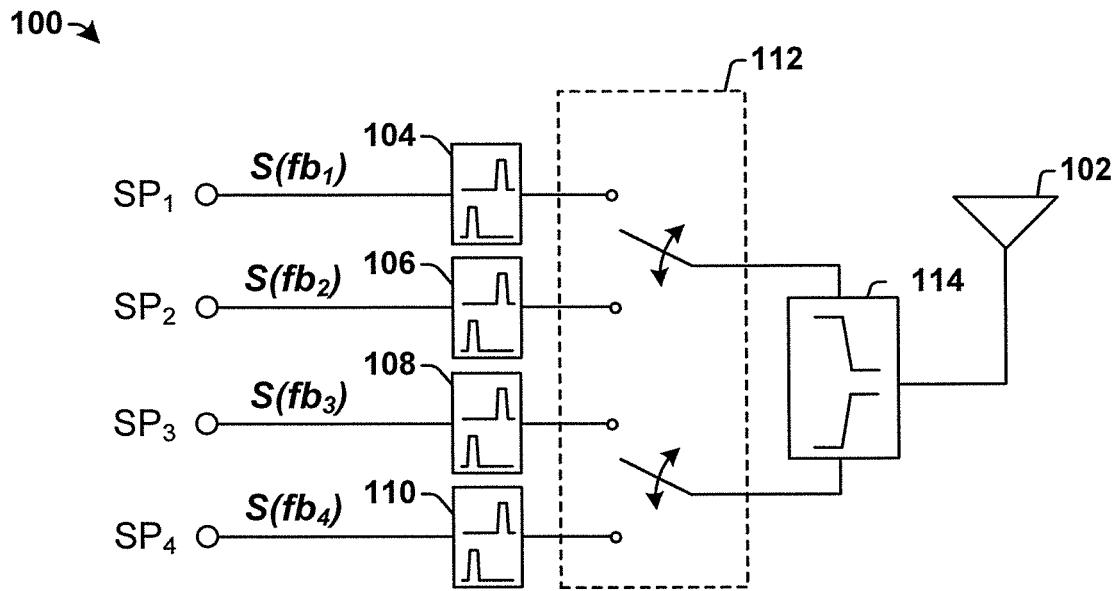
FIG. 1 illustrates a conventional transceiver system that can operate over a plurality of frequency bands.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details.

FIG. 1 illustrates a conventional transceiver 100 that can operate over a plurality of frequency bands. The transceiver 100 comprises a plurality of signal paths, $SP_1$-$SP_4$, wherein respective signal paths are configured to exchange signals with an antenna 102 at different frequency bands. For example, a first signal path $SP_1$ is configured to exchange signals at a first frequency band $fb_1$ with antenna 102, while a second signal path $SP_2$ is configured to exchange signals at a second frequency band $fb_2$ with antenna 102, etc. wherein the frequency bands may have separate transmit and receive frequencies.

To operate over multiple frequency bands, the signals of each frequency band must be isolated from signals of another frequency band. To achieve such isolation, filters may be placed in the signal paths, $SP_1$-$SP_4$. For example, in transceiver 100 each signal path, $SP_1$-$SP_4$, respectively comprises a duplex filter, 104-110, with a receive filter having a stop band at a transmit frequency and a transmit filter with a stop band at a receive frequency. The duplex filters, 104-110, enable a signal path, $SP_1$-$SP_4$, to transmit signals and receive signals at a same time by providing for isolation between transmitted signals from received signals.

The transceiver 100 may additionally comprise a diplex filter 114 having a high pass filter and a low pass filter. The diplex filter 114 is connected to first and second antenna ports, $AP_1$ and $AP_2$, of an antenna switch module (ASM) 112 and enables the transceiver system 100 to act in a carrier aggregation mode of operation, wherein signals are conveyed at frequencies comprising an aggregation of a high frequency band and a low frequency band. For example, ASM 112 may concurrently connect a signal path having high frequency signals (e.g., $SP_1$ or $SP_2$) to the first antenna port $AP_1$ and a signal path having low frequency signals (e.g., $SP_3$ or $SP_4$) to the second antenna port $AP_2$ (e.g., to support signal path combinations $SP_1+SP_3$, $SP_1+SP_4$, $SP_2+SP_3$, or $SP_2+SP4$).

While the use of diplex filters and duplex filters provides for sufficient isolation of signals for transceiver systems operating over multiple frequency bands, each filter increases the cost (e.g., the silicon footprint) and insertion loss and thus power consumption of a transceiver system.

Accordingly, the present disclosure relates to a transceiver system configured to provide isolation through selective matching of filters in a plurality of signal paths that are configured to operate over a plurality of frequency bands. The transceiver system comprises a plurality of signal paths selectively coupled to an antenna port of an antenna switch module (ASM), wherein respective signal paths comprise a filtering element having a stop band and a pass band. A control unit is configured to generate one or more control signals that operate one or more switching elements within the ASM to connect one or more of the plurality of signal paths to the antenna port. By connecting signal paths to the antenna port, the ASM combines filtering elements within the selected signal paths to generate a collective filter response that can provide for isolation between the one or more of the plurality of signal paths.

Figure 2:
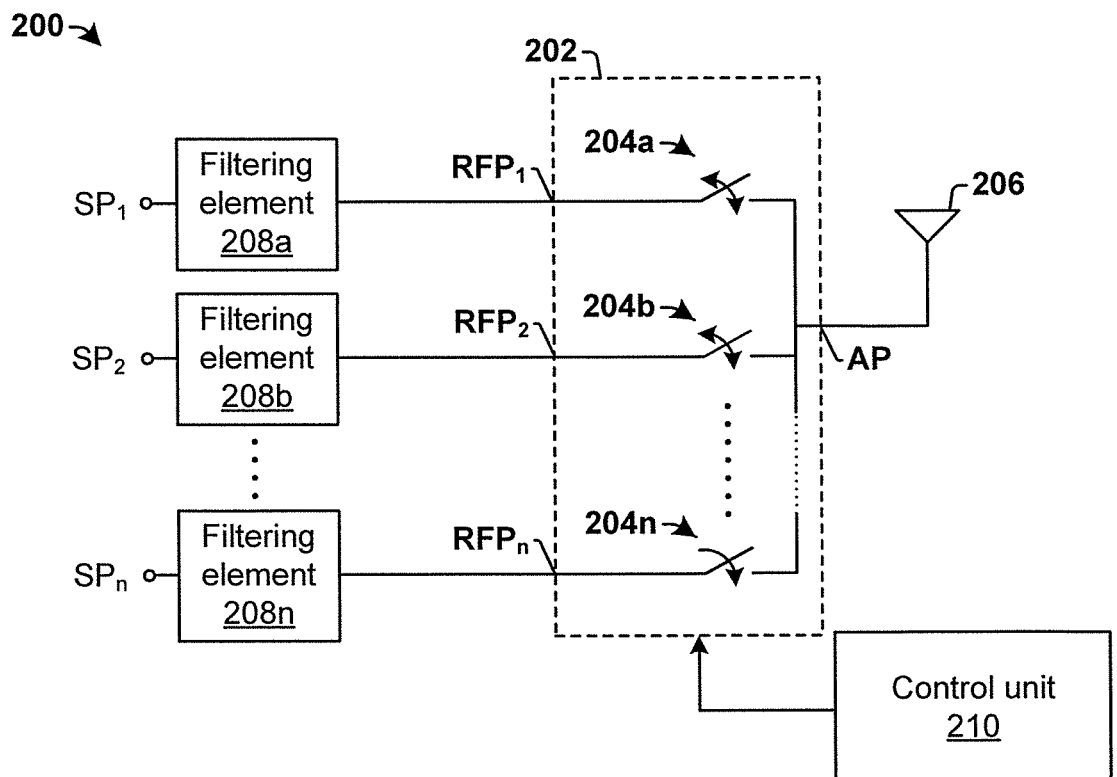
FIG. 2 illustrates a disclosed transceiver system having a plurality of signal paths selectively connected to an antenna port by an antenna switch module.

FIG. 2 illustrates a disclosed transceiver system 200. The transceiver system 200 comprises a plurality of signal paths $SP_1, SP_2, \ldots, SP_n$ configured to exchange signals with an antenna 206. In some examples, wherein the transceiver system 200 comprises a LTE-FDD (Long term evolution, Frequency-division duplexing) system, each signal path corresponds to a separate LTE band.

Respective signal paths $SP_1, SP_2, \ldots,$ or $SP_n$ comprise filtering elements 208 that filter signals according to a filtering response. In various cases, the filtering elements may comprise a single filter (e.g., a surface acoustic wave (SAW)

filter, a bulk acoustic wave (BAW) filter, a film bulk acoustic resonator (FBAR) filter, etc.) or more than one filter (e.g., a duplex filter with a reception and transmission filter). The filtering elements 208 have a filtering response with one or more pass bands (i.e., that pass signals with a frequency within a pass band) and one or more stop bands (i.e., that attenuate signals with a frequency within a stop band). For example, the first signal path $SP_1$ may comprise a first filtering element 208a having a first pass band and a first stop band, while the second signal path $SP_2$ may comprise a second filtering element 208b having a second pass band and a second stop band. In some examples, the first stop band may have a high impedance at the second pass band and the second stop band may have a high impedance at the first pass band.

The plurality of signal paths $SP_1, SP_2, \ldots, SP_n$ are connected to an antenna port AP by way of an antenna switch module (ASM) 202 having a plurality of switching elements 204a-204n. The ASM 202 comprises a plurality of RF ports $RFP_1$-$RFP_n$. Each RF port is connected to a signal path, so that each signal path is connected to a switching element that is configured to respectively connect one of the plurality of signal paths $SP_1, SP_2, \ldots, SP_n$ to the antenna port AP. For example, a first switching element 204a is configured to selectively connect the first signal path $SP_1$ to the antenna port AP, a second switching element 204b is configured to connect the second signal path $SP_2$ to the antenna port AP, etc. In various cases, the plurality of switching elements 204a-204n may comprise switches or transistor devices, for example.

A control unit 210 is configured to generate one or more control signals $S_{CTRL}$ that are provided to the ASM 202 to control operation of the plurality of switching elements 204a-204n. The one or more control signals $S_{CTRL}$ operate the plurality of switching elements 204a-204n to connect one or more of the plurality of signal paths $SP_1, SP_2, \ldots,$ and/or $SP_n$ to the antenna port AP. By selectively connecting one or more signal paths $SP_1$-$SP_n$ to the antenna port AP, the filtering responses of the filtering elements within the selected one or more signal paths are combined to achieve a collective filtering response that is based upon filters in the selected signal paths.

The control unit 210 may be configured to generate control signals $S_{CTRL}$ that operate the ASM 202 to connect two or more of the plurality of signal paths to the antenna port AP to provide for a filtering response that causes the selected signal paths to operate as a diplexer that enables a carrier aggregation mode of operation. For example, the control unit 210 may connect first and second signal paths, $SP_1$ and $SP_2$, to the antenna port AP by way of ASM 202 to add a filtering response (e.g., a low-pass filter) of a first filtering element 208a in the first signal path $SP_1$ and a filtering response (e.g., a high-pass filter) of a second filtering element 208a in the second signal path $SP_1$ to generate a collective frequency response. The collective frequency response is similar to that of a diplex filter, but allows for connected signal path filters to have pass bands that are adjacent to one another (e.g., in contrast to diplex filters, which typically have an increasing insertion loss for carrier aggregation bands separated by less than an octave).

Alternatively, the control unit 210 may be configured to generate control signals $S_{CTRL}$ that operate the ASM 202 to connect two or more of the plurality of signal paths to the antenna port AP to provide for a filtering response equivalent to a duplexer. Such a filtering response enables matching of the filtering elements 208a-208n to allow for transmission of a frequency band (e.g., LTE band 3) by one signal path and reception of the frequency band by another signal path. Matching the filtering responses allows for the signal paths to be used for multiple frequency bands, reducing the number of signal paths in the transceiver system 200 (e.g., to a number of signal paths that is less than the number of frequency bands over which the transceiver system operates).

Figure 3:
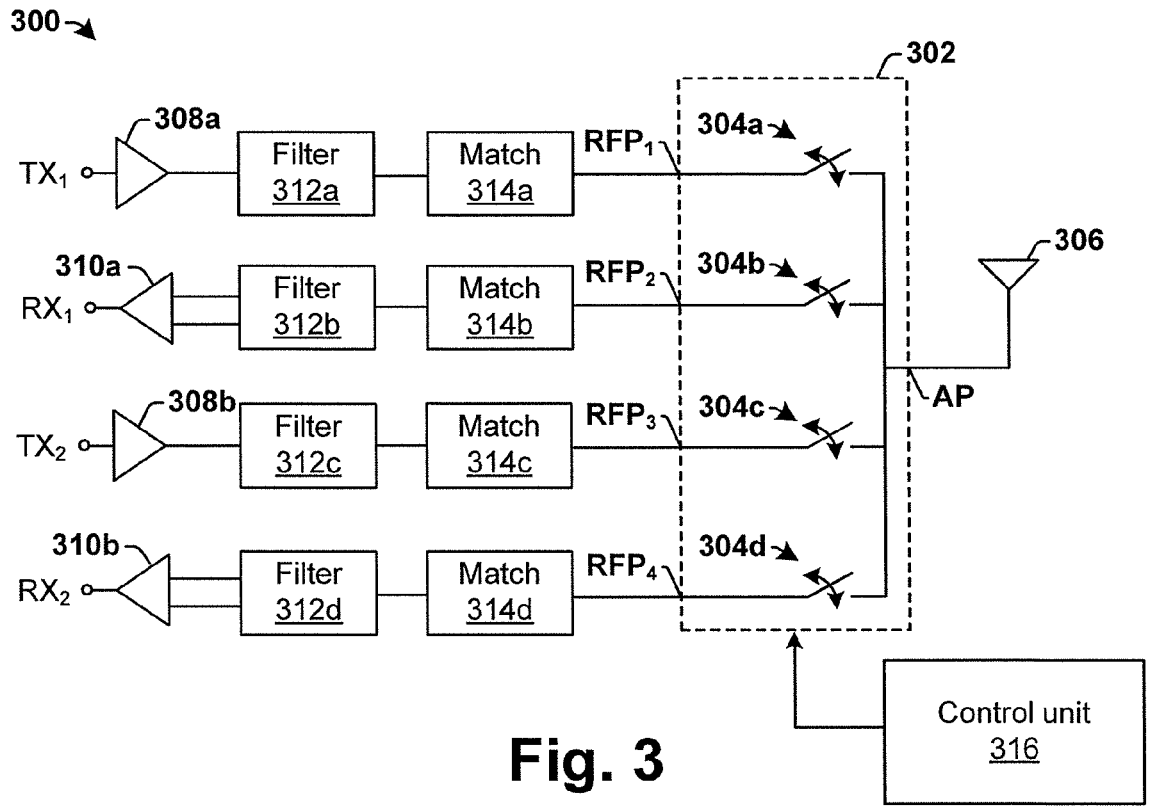
FIG. 3 illustrates a more detailed example of a disclosed transceiver system having filtering elements comprising a single filter.

FIG. 3 illustrates a more detailed example of a disclosed transceiver system 300 having filtering elements comprising a single filter.

Transceiver system 300 comprises signal paths $TX_1, RX_1, TX_2,$ and $RX_2$. A first signal path $TX_1$ comprises a transmission chain configured to provide signals having a first frequency to an RF port $RFP_1$. The transmission chain comprises a power amplifier 308a coupled to a first filter 312a having a first pass band configured to pass the first frequency and a first stop band. A second signal path $RX_1$ comprises a receiver chain configured to receive signals having a second frequency from an RF port $RFP_2$. The receiver chain comprises a low noise amplifier (LNA) 310a coupled to a second filter 312b having a second pass band configured to pass the second frequency and a second stop band. A third signal path $TX_2$ comprises a transmission chain having a power amplifier 308b coupled to a third filter 312c having a third pass band configured to pass a third frequency and a third stop band. A fourth signal path $RX_2$ comprises a reception chain having a LNA 310b coupled to a fourth filter 312d having a fourth pass band configured to pass a fourth frequency and a fourth stop band.

The plurality of transmission paths, $TX_1$ and $TX_2$, are configured to transmit signals at different frequency bands, so that the transceiver system 300 is able to operate as a multi-band transmitter configured to transmit electromagnetic radiation at a variety of different frequencies. The different frequency bands may be used by different frequencies of a same wireless standard (e.g., different LTE bands). Similarly, the reception paths, $RX_1$ and $RX_2$, are configured to receive signals at different frequency bands so that the transceiver system 300 is able to operate as a multi-band receiver configured to receive electromagnetic radiation at a variety of different frequencies.

An antenna switch module (ASM) 302 may operate switching elements 304a-304d to connect one or more transmission chains, $TX_1$ and/or $TX_2$, and/or one or more reception chains, $RX_1$ or/and $RX_2$, to an antenna port AP to generate a collective filtering response based upon filters that are in the connected transmission and reception chains.

In some cases, matching networks 314a-314d are located between the filters 312a-312d and the ASM 302 in the plurality of signal paths. The matching networks 314a-314d are configured change the impedance of combined signal paths as seen by the antenna port AP to a value that minimizes the insertion loss. The matching networks 314a-314d may introduce a phase shift into a signal to change the impedance. In some examples, the matching networks 314a-314d comprise transmission lines having a fixed length. In such an example, the fixed length of a transmission line can be determined based upon predetermined combinations of filters for carrier aggregation or for predetermined combinations of frequency bands. Alternatively, the matching networks 314a-314d may comprise tunable matching networks. For example, the matching networks 314a-314d may comprise transmission lines having a "variable length" or the matching networks 314a-314d may comprise a pi circuit having two capacitors and an inductor, for example.

Figure 4:
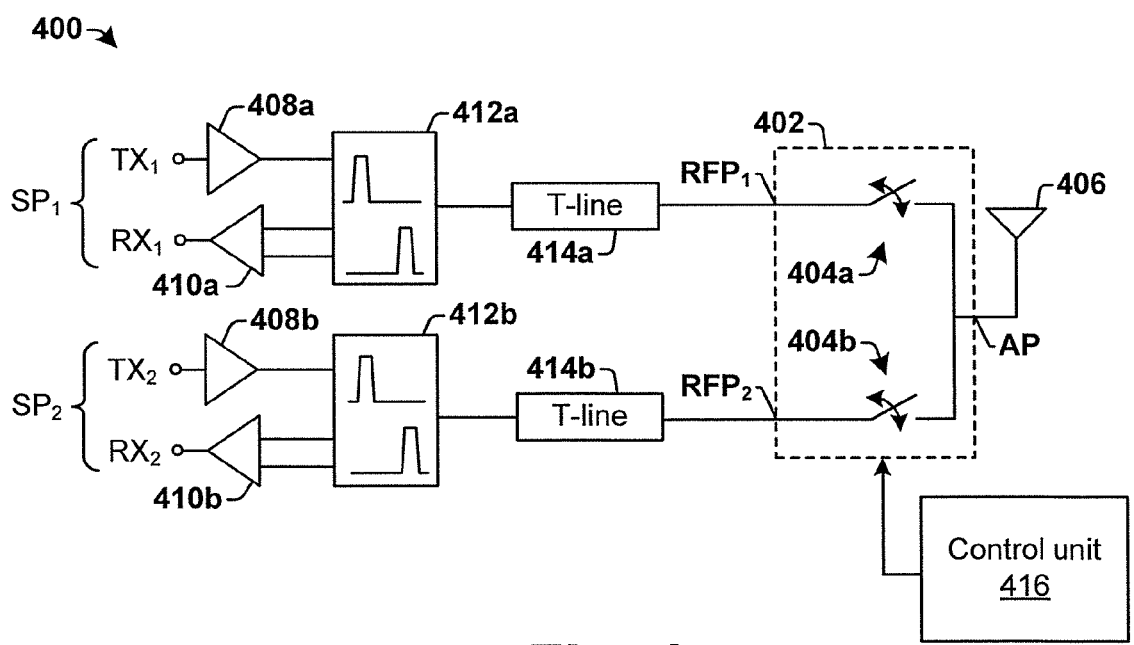
FIG. 4 illustrates a more detailed example of a disclosed transceiver system having filtering elements comprising duplexer filters.

FIG. 4 illustrates a more detailed example of a disclosed transceiver system 400. The disclosed transceiver system implements a same functionality as shown in FIG. 1, but without the use of a diplexer.

Transceiver system 400 comprises a first signal path $SP_1$ and a second signal path $SP_2$. The first signal path $SP_1$ comprises a first transmission chain $TX_1$ having a power amplifier 408a configured to provide a signal having a first frequency to an antenna port AP for wireless transmission by antenna 406. The first signal path $SP_1$ further comprises a first reception chain $RX_1$ having a low noise amplifier 410a configured to receive a signal having a second frequency from the antenna port AP. The first transmission chain $TX_1$ and first reception chain $RX_1$ are connected to a filtering element comprising a first duplex filter 412a configured to provide for isolation between the first transmission chain $TX_1$ and the first reception chain $RX_1$. In particular, the first duplex filter 412a comprises a first transmit filter having a pass band at the first frequency range and a stop band at the second frequency range and a first receive filter having a pass band at the second frequency range and a stop band at the second frequency range.

The second signal path $SP_2$ comprises a second transmission chain $TX_2$ having a power amplifier 408b configured to provide a signal having a third frequency to the antenna 406 for wireless transmission. The second signal path $SP_2$ further comprises a second reception chain $RX_2$ having a low noise amplifier 410b configured to receive a signal having a fourth frequency from the antenna port AP. The second transmission chain $TX_2$ and second reception chain $RX_2$ are connected to a filtering element comprising a second duplex filter 412b configured to provide for isolation between the second transmission chain $TX_2$ and the second reception chain $RX_2$. In particular, the second duplex filter 412b comprises a second transmit filter having a pass band at the third frequency range and a stop band at the fourth frequency range, and a second receive filter having a pass band at the fourth frequency range and a stop band at the third frequency range.

An antenna switch module (ASM) 402 is connected to the first and second signal paths SP1 and SP2 at RF ports RFP1 and RFP2. A control unit 416 is configured to operate switching elements 404a-404b of the ASM 402 to connect one or more of the signal paths, $SP_1$ and/or $SP_2$ to the antenna port AP to generate a filtering response that is equal to the filter response of the filters that are in the connected signal paths. Matching networks 414a-414b may be located between the filters 412a-412b and the ASM 402 to minimize the insertion loss.

FIGS. 5A-5D illustrate a more detailed example of an LTE (Long Term Evolution) transceiver system 500 configured to concurrently transmit and/or receive signals over one LTE band (i.e., in a single band mode) or over multiple LTE bands (i.e., in a carrier aggregation mode).

Figures 5A, 5B:
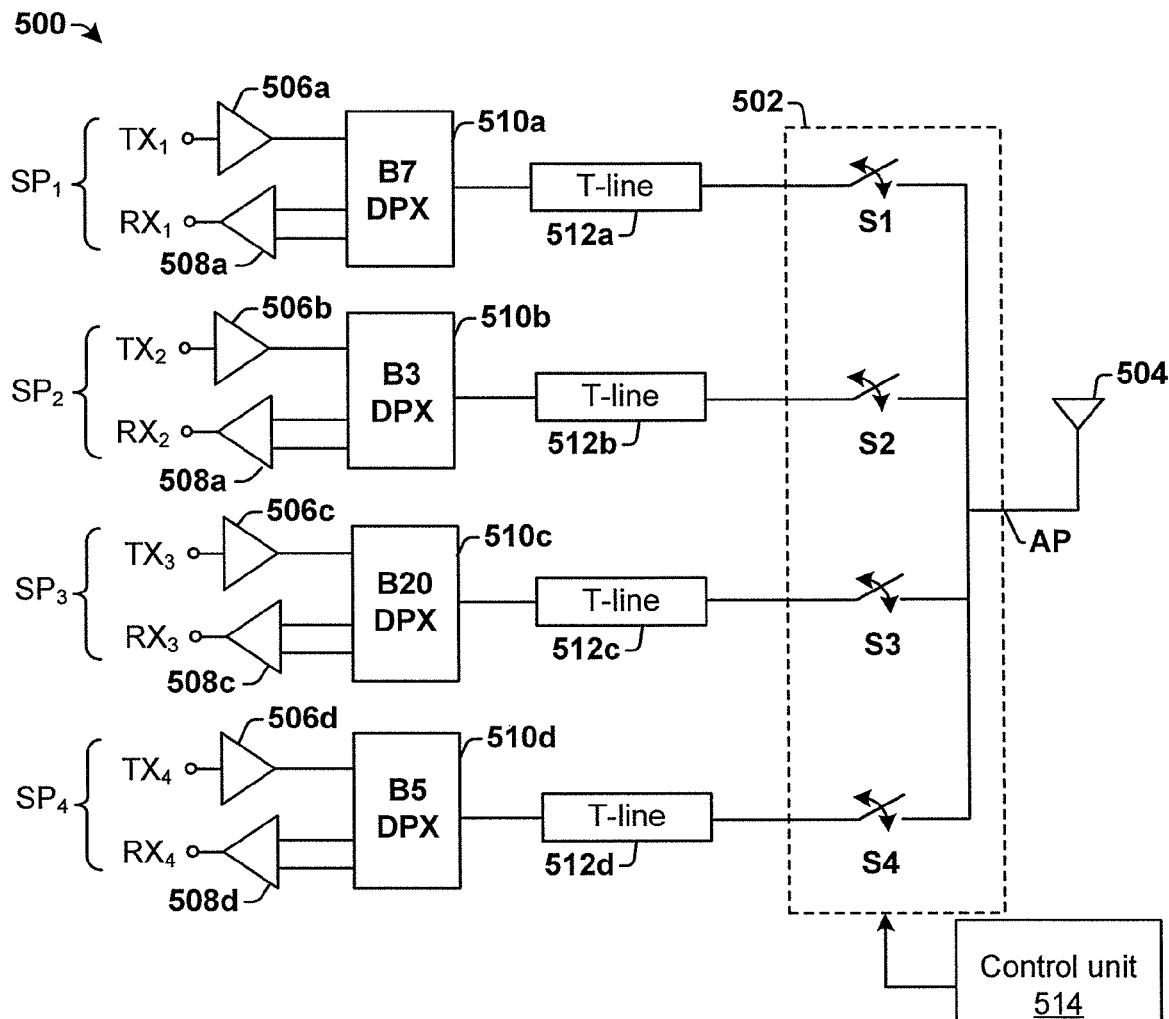
FIGS. 5A-5D illustrate a more detailed example of an LTE (Long Term Evolution) transceiver system configured to transmit and/or receive signals over one LTE band or over multiple LTE bands.

FIG. 5A illustrates a block diagram of a disclosed transceiver system 500 that is able to operate in a single band mode of operation or in a carrier aggregation (C/A) mode of operation.

Transceiver system 500 comprises a plurality of signal paths $SP_1$-$SP_4$, wherein respective signal paths $SP_1$-$SP_4$ have a duplex filter 510a-510d that allows for transmission and reception at an LTE band. For example, the first signal path $SP_1$ may comprise a power amplifier 506a and a LNA 508a connected to a first duplex filter 510a that allows for transmission and reception at LTE band B7 (i.e., having a pass band for transmission at 2500-2570 MHz and having a pass band for reception at 2620-2690 MHz). The second signal path $SP_2$ may comprise a power amplifier 506b and a LNA 508b connected to a second duplex filter 510b that allows for transmission and reception at LTE band B3 (i.e., having a pass band for transmission at 1710-1785 MHz and having a pass band for reception at 1805-1880 MHz). The third signal path $SP_3$ may comprise a power amplifier 506c and a LNA 508c connected to a third duplex filter 510c that allows for transmission and reception at LTE band B20 (i.e., having a pass band for transmission at 832-862 MHz and having a pass band for reception at 791-821 MHz). The fourth signal path $SP_4$ may comprise a power amplifier 506d and a LNA 508d connected to a fourth duplex filter 510d that allows for transmission and reception at LTE band B5 (i.e., having a pass band for transmission at 824-849 MHz and having a pass band for reception at 869-894 MHz). Filters within respective signal paths have a high reflection (e.g., a high impedance) at frequency outside of their pass bands.

In the single band mode of operation, ASM 502 is configured to operate one switch S1, S2, S3, or S4 to connect a single signal path to antenna port AP, so that transceiver system 500 can transmit and/or receive signals via antenna 504 using a single LTE frequency band (e.g., LTE band B3, LTE band B7, etc.). In the carrier aggregation mode of operation, ASM 502 is configured to operate a plurality of switches S1, S2, S3, and/or S4 to simultaneously connect multiple signal paths to antenna port AP, so that transceiver system 500 can concurrently transmit and/or receive signals using more than one LTE frequency band (e.g., LTE bands B7 and B20) to increase transmission/reception bandwidths, and data transfer rates, over that which can be achieved in a single band mode of operation. It will be appreciated that the LTE frequency bands used in the carrier aggregation mode of operation may comprise a contiguous frequency range or may comprise non-contiguous frequency range.

FIG. 5B is a table 516 showing operation of the plurality of switches S1-S4 in the ASM 502 by control unit 514 to match filters for various modes of single band operation and for various modes of carrier aggregation operation.

In particular, table 516 shows switching states for switches within ASM 502 for single band modes of operation in LTE bands B7, B3, B20 and B5. For example, to transmit and receive signals at LTE band B7, switch S1 is closed to connect transmission paths $TX_1$ and reception path $RX_1$ to antenna port AP, while switches S2-S4 are opened to disconnect transmission paths $TX_2$-$TX_4$ and $RX_2$-$RX_4$ from antenna port AP. Similarly, to transmit and receive signals at LTE bands B3, B20, and B5, switches S2, S3, and S4 are respectively closed while other switches are opened.

Table 516 also shows switching states for switches within ASM 502 for carrier aggregation modes of operation in LTE bands B7 and B3, bands B7 and B5, and bands B7 and B20. For example, to transmit and receive signals at LTE band 7 and band 3, switch S1 is closed to connect transmission path $TX_1$ and reception path $RX_1$ to antenna port AP, switch S2 is closed to connect transmission path $TX_2$ and reception path $RX_2$ to antenna port AP, while switches S3-S4 are opened to disconnect transmission paths $TX_3$-$TX_4$ and reception paths $RX_3$-$RX_4$ from antenna port AP. Since, duplex filters have full reflection in the stop band, duplex filters 510a and 510b can be matched while providing for sufficient isolation between the signal paths. Similarly, to transmit and receive signals at LTE bands B7 and B5, switches S2 and S4 are closed, while switches S1 and S3 are opened. In some cases, the performance of filter matching can be improved with a matching network or T-line 512 that adjusts the phase of signals to convert the impedance to be close to infinite.

Figure 5C:
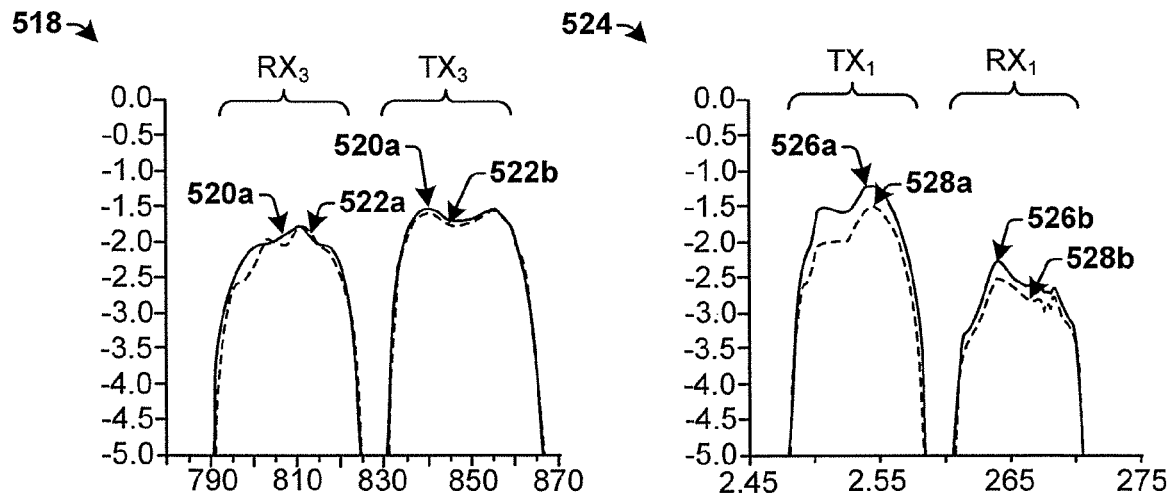
Figure 5D:
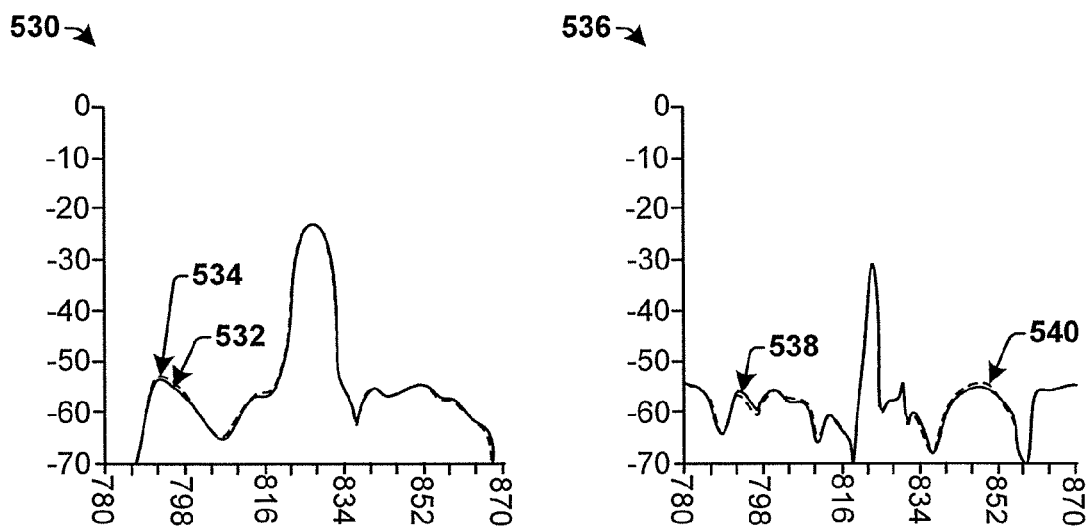

FIGS. 5C-5D illustrate graphs 518, 524, 530, and 536 showing operation of transceiver system 500 with the disclosed filter matching in comparison to that of the single band operation. In comparison a system having a diplexer, the disclosed transceiver system 500 has a reduced insertion loss of approximately 0.5 dB for single band characteristic. It will be appreciated that the graphs were generated based upon off the shelf filters. In some cases, the filters can be optimized to improve the stop band impedance of the filters.

FIG. 5C illustrates graphs 518 and 524 showing the insertion loss of filter matching to transmit and receive signals in a carrier aggregation mode using LTE bands B20 and band B7 respectively. In particular, the solid lines 520 and 526 show the performance of the single duplexers and the ASM when working in the conventional single band mode, while the dashed lines 522 and 528 show the performance when both duplexers are switched in at the same time and properly matched to each other. Comparison of lines 520 and 522 show that for band B20 (graph 518) the effect of the loading of the band B7 filter is negligible. Comparison of lines 526 and 528 show that for band B7 (graph 524) the loading of the band B20 filter adds approximately 0.5 dB loss. However, the 0.5 dB loss is comparable with the loss in the diplexer in the conventional setup.

FIG. 5D illustrates graphs 530 and 536 showing the isolation provided by the filter combination in a carrier aggregation mode of operation using LTE bands B20 and B7. The solid lines 532 and 538 show the isolation of the single duplexers and the ASM when working in the conventional single band mode, while the dashed lines 534 and 540 show the isolation when both duplexers are switched in at the same time and properly matched to each other. Comparison of lines 532 and 534 show that for band B20 (graph 530) the effect of the loading of the band B7 filter has a negligible effect on isolation. Similarly, comparison of lines 538 and 540 show that for band B7 (graph 536) the loading of the band B20 filter has a negligible effect on isolation.

In addition to not increasing isolation or insertion loss, by disconnecting signal paths from the antenna port AP when not needed, the insertion loss can actually be reduced in many cases. For example, chart 1 illustrates the insertion losses of transceiver system 500 in various single mode and carrier aggregation modes of operation in comparison to a transceiver system having a conventional architecture comprising a diplex filter.

CHART 1

| Band | Conventional setup Duplexer | | Dislcosed setup Duplexer | |
|---|---|---|---|---|
| | Single band | CA | Single band | CA |
| Band 20 | 0.5 dB | 0.5 dB | 0 dB | 0 dB |
| Band 7 | 0.5 dB | 0.5 dB | 0 dB | 0.5 dB |
| All other bands | 0.5 dB | 0.5 dB | 0 dB | 0 dB |

As shown in chart 1, the disclosed transceiver system 500 typically achieves a lower insertion loss since it does not comprise a diplexer, which adds an additional insertion loss to the system. For example, for a single mode of operation the insertion loss of the transceiver system 500 is reduced from 0.5 dB to 0 dB. For a carrier aggregation mode of operation, the insertion loss of the transceiver system 500 is reduced from 0.5 dB to 0 dB in LTE bands not being used and is equal to that of the conventional transceiver system in LTE bands being used.

Figure 6A:
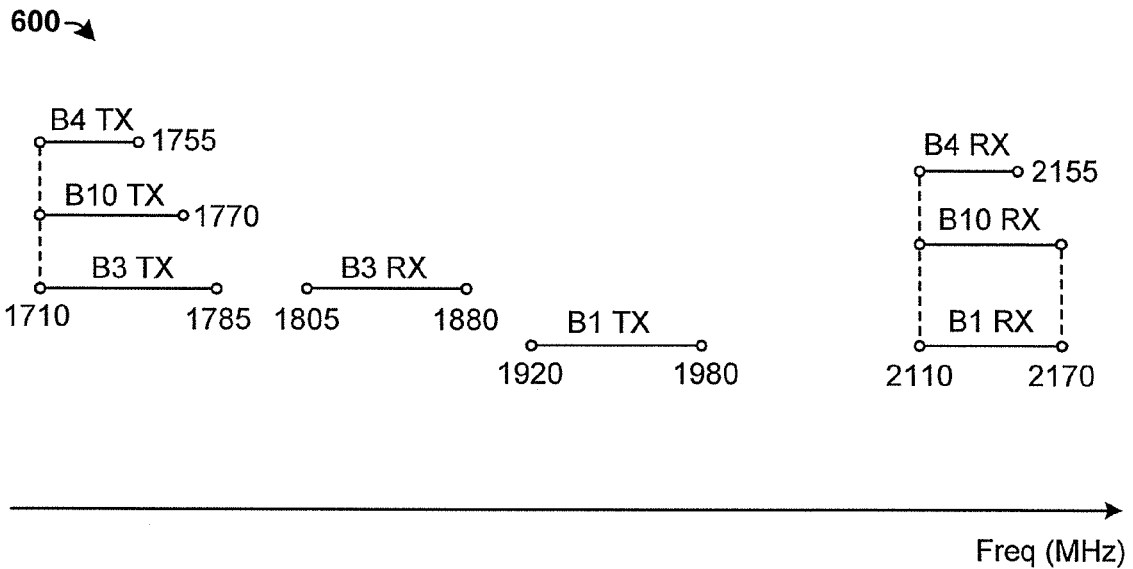
FIGS. 6A-6C illustrate a more detailed example of an LTE/3G (Long Term Evolution) transceiver system configured to use different signal paths to respectively transmit and/or receive multiple LTE/3G bands.
Figure 6B:
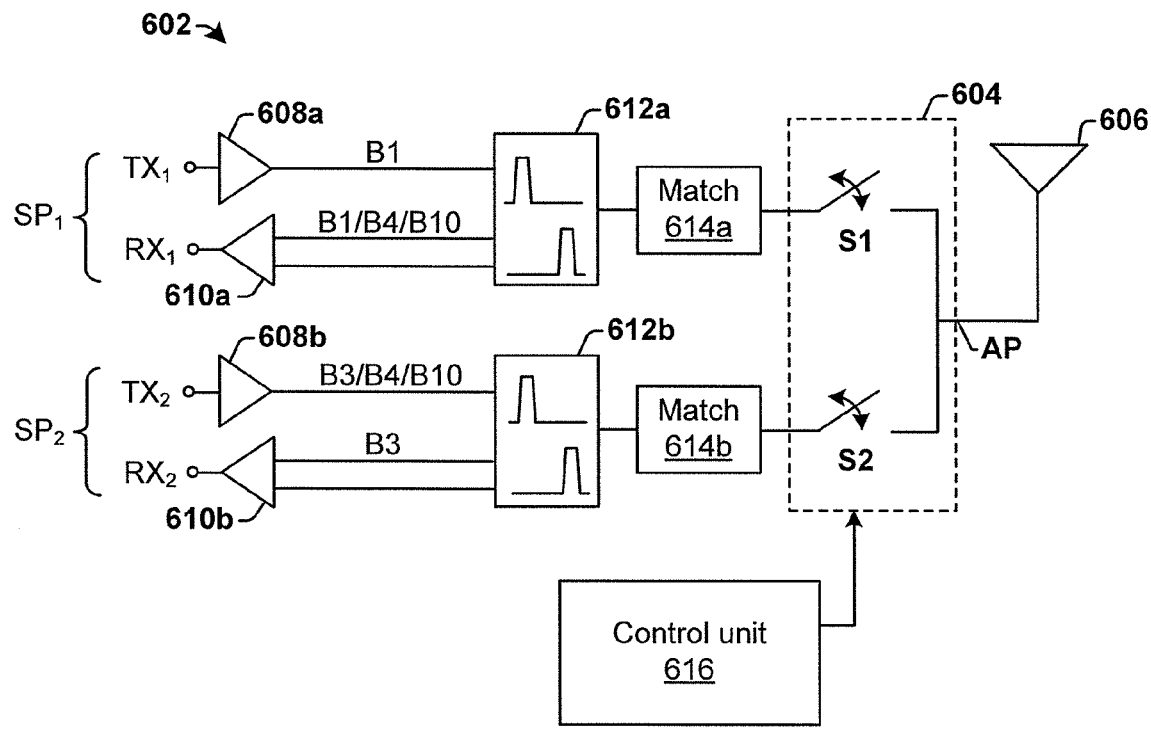
Figures 6C, 7A:
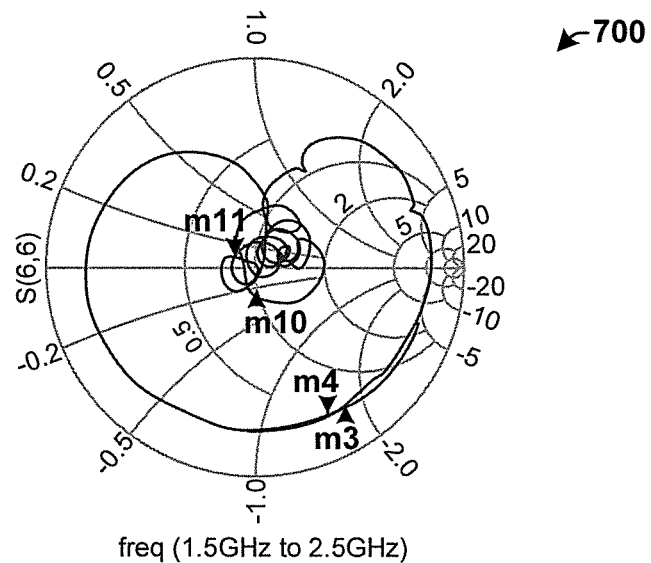
FIGS. 7A-7B are Smith charts showing operation of the matching networks in a disclosed transceiver system.

FIGS. 6A-6C illustrate a more detailed example of a disclosed transceiver system configured to use different signal paths to respectively transmit and/or receive signals at multiple 3G and LTE bands. By using different signal paths to transmit and/or receive signals at multiple LTE bands, the on chip size of a transceiver system can be reduced (e.g., by approximately 10%) since less power amplifiers, LNA, and duplexers are used.

FIG. 6A is a table 600 showing the frequency spectrum of the various 3G/LTE frequency bands. As shown in table 600, 3G/LTE frequency bands B4, B10, and B3 have an overlapping transmit (uplink) frequency spectrum, while 3G/LTE frequency bands B4, B10, and B1 have an overlapping receive (downlink) frequency spectrum.

Referring to FIG. 6B, transceiver system 602 comprises a first signal path $SP_1$ having a first transmission chain $TX_1$ and a first reception chain $RX_1$ connected to a first duplex filter 612a. The first transmission chain $TX_1$ has a power amplifier 608a configured to transmit signals at 3G/LTE band B1 (i.e., the first duplex filter 612a has a pass band for transmission of 1920-1980 MHz). The first reception chain $RX_1$ has a LNA 610a configured to receive signals at 3G/LTE bands B1, B4, and B10 (i.e., the first duplex filter 612a has a pass band for reception of 2110-2170 MHz). The first reception chain $RX_1$ is able to receive signals for multiple 3G/LTE bands since the reception frequency band of the multiple 3G/LTE bands overlap.

Transceiver system 602 further comprises a second signal path $SP_2$ having a second transmission chain $TX_2$ and a second reception chain $RX_2$ connected to a second duplex filter 612b. The second transmission chain $TX_2$ has a power amplifier 608b configured to transmit signals at 3G/LTE bands B3, B4, and B10 (i.e., the second duplex filter 612b has a pass band for transmission of 1710-1785 MHz). The second reception chain $RX_2$ has a LNA 610b configured to receive signals at 3G/LTE band B3 (i.e., the second duplex filter 612b has a pass band for reception of 1805-1880 MHz). The second transmission chain $TX_2$ is able to transmit signals for multiple 3G/LTE bands since the transmission frequency of the multiple 3G/LTE bands overlap.

FIG. 6C is a table 618 showing operation of the plurality of switches S1-S4 in the ASM 604 to match filters in the different signal paths, $SP_1$ and $SP_2$, to transmit and receive signals at different 3G/LTE bands.

To transmit and receive signals at 3G/LTE band B1, switch S1 is closed to connect transmission path $TX_1$ and reception path $RX_1$ to antenna port AP, while switch S2 is opened to disconnect transmission path $TX_2$ and reception path $RX_2$ from antenna port AP. Since, duplex filters have full reflection in the stop band, duplex filter 612a provides for sufficient isolation between the transmission path $TX_1$ and reception path $RX_1$.

To transmit and receive signals at 3G/LTE band B3, switch S2 is closed to connect transmission path $TX_2$ and reception path $RX_2$ to antenna port AP, while switch S1 is opened to disconnect transmission path $TX_1$ and reception path $RX_1$ from antenna port AP.

To transmit and receive signals at 3G/LTE band B4 or 3G/LTE band B10, switch S1 is closed to connect reception path $RX_1$ to antenna port AP, and switch S2 is closed to connect transmission path $TX_2$ to antenna port AP. Since, duplex filter has full reflection in the stop band, duplex filters 612a and 612b can be matched to provide a reception path and a transmission path for 3G/LTE bands B4 and B10.

Figure 7B:
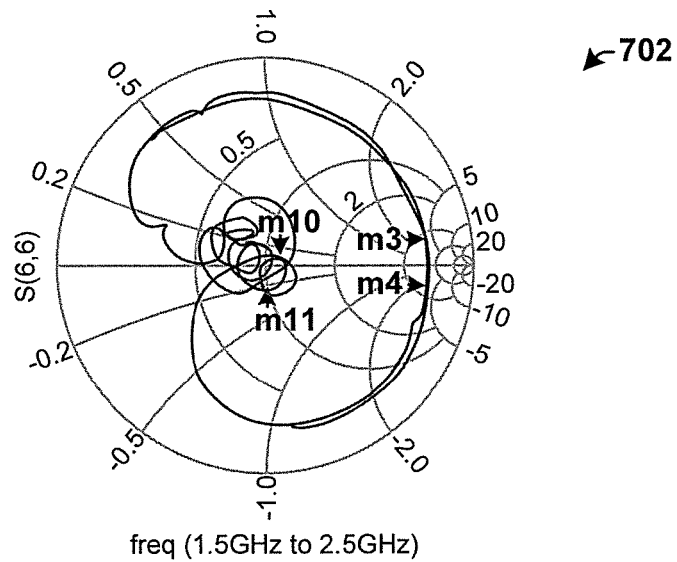

FIGS. 7A-7B are Smith charts, 702 and 704, showing operation of the matching networks for 3G/LTE band B3 (i.e., having a pass band of 1710-1785 for uplink). In the illustrated Smith charts, signals close to the middle of the charts have good match (i.e., low reflection, 50 ohm), while signals further to boarder of chart the better reflection (i.e., high impedance). Therefore, for a good SAW filter, signals in the pass band are illustrated as being in the middle of the chart and signals in the stop band are illustrated as being in the exterior of the chart. As shown in FIGS. 7A-7B, signals m3 (having a frequency of 2.110 GHz) and m4 (having a frequency of 2.170 GHz) are outside of the pass band, while signals m10 (having a frequency of 1.710 GHz) and m11 (having a frequency of 1.755 GHz) are within the pass band.

Smith chart 702 shows the impedance seen at the band B3 without a matching network. As illustrated in Smith chart 702, the impedance for a signal having a frequency outside of the pass band of the transceiver system without matching gives a complex impedance of $Z_0*(0.547-j1.755)=92$ ohms for signal m3 and a complex impedance of $Z_0*(0.452-j1.528)=80$ ohms for signal m4.

Smith chart 704 shows the impedance seen at the band B3 with a disclosed matching network. As illustrated in Smith chart 704, by operating a matching network to introduce a phase shift into a signal that is exchanged by the antenna port, the impedance can be increased. For example, introducing a phase shift to optimize the matching causes the filtering response to rotate, causing the complex impedance for signal m3 to increase to $Z_0*(5.820-j3.427)=338$ ohms and causing the complex impedance for signal m4 to increase to $Z_0*(6.302-j2.934)=348$ ohms.

Therefore, as shown in FIGS. 7A-7B, by operating a matching network to introduce a phase shift into a signal, the impedance of a filter can be varied so that the stop band has minimum impact on the pass band of another filter. In the case of a transceiver system having one filter matching combination, the phase shift can be predetermined since the filter combination is known. However, In the case of a transceiver system having multiple filter matching combinations, the phase shift may comprise a variable/tunable phase shift since the filter combinations are not known.

It will be appreciated that the filtering elements may be optimized to improve the performance illustrated in the charts disclosed herein (e.g., FIGS. 5B, 5C, 7A, 7B). For example, when matching filters within two signal paths to achieve a filtering response, the filters can be optimized along with a value of the matching network to achieve a high impedance.

Figure 8:
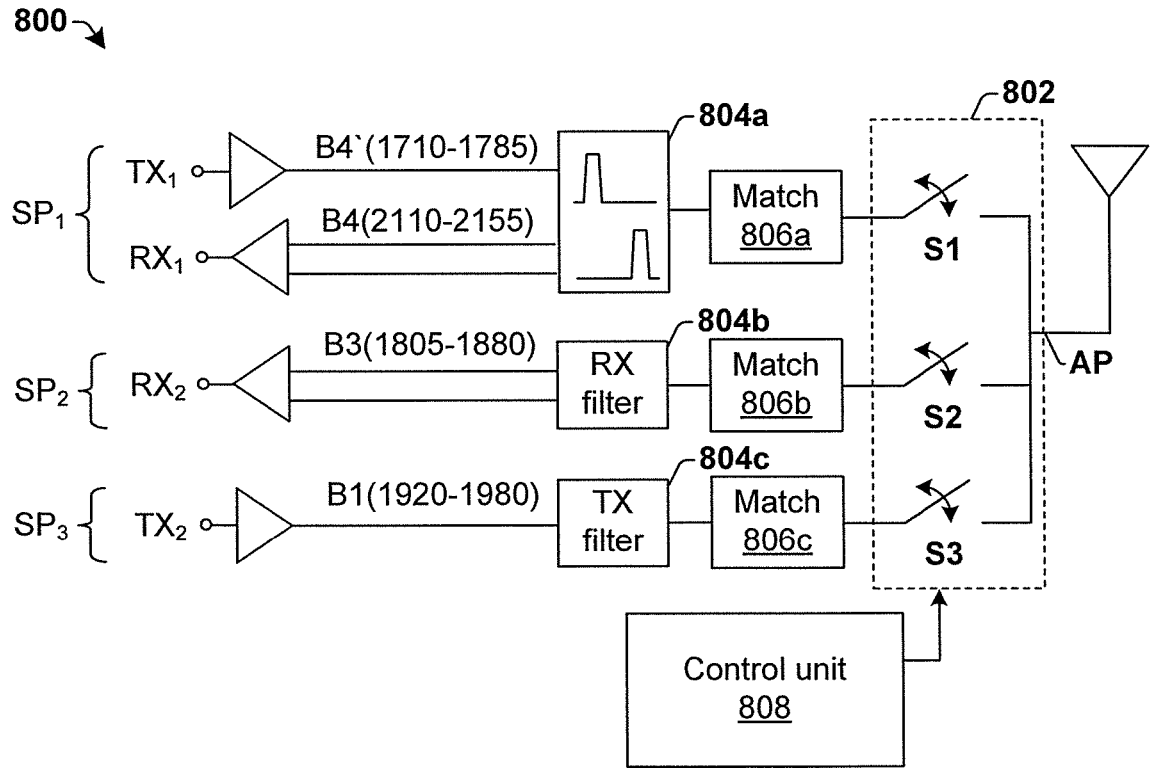
FIG. 8 illustrates an alternative example of a disclosed transceiver system having signal paths with mixed filters.

It will be appreciated that the disclosed transceiver system may comprise signal paths having a combination of different filtering elements. For example, FIG. 8 illustrates an alternative example of a disclosed transceiver system having mixed filtering elements. Although FIG. 8 is described in relation to specific frequency bands and filtering elements, it will be appreciated that the illustrated cases are only examples may be implemented with alternative combinations of frequency bands and/or filtering elements.

FIG. 8 illustrates a transceiver system 800 comprising signal paths $SP_1$-$SP_3$. The first signal path $SP_1$ comprises a transmit path $TX_1$ and a receive path $RX_1$ having a duplex filter 804a connected to the ASM 802 by way of a first matching network 806a. The duplex filter 804a has a first passband corresponding to a modified transmit frequency of LTE band 4 (1710-1785 MHz) and a second passband corresponding to the receive frequency of LTE band 4 (2110-2155 MHz). The second signal path $SP_2$ comprises a receiver path $RX_2$ having a receive filter 804b connected to the ASM 802 by way of a second matching network 806b. The receive filter 804b has a passband corresponding to the receive frequency of LTE band 3 (1805-1880 MHz). The third signal path $SP_3$ comprises a transmit path $TX_2$ connected to a transmit filter 804c connected to the ASM 802 by way of a third matching network 806c. The transmit filter 804c has a passband corresponding to the transmit frequency of LTE band 1 (1920-1980 MHz).

Control unit 808 is configured to concurrently connect two or more of signal paths $SP_1$-$SP_3$ to cover a LTE bands 1, 3, and 4. For example, to cover LTE band 3, which transmit at 1710-1755 MHz and receives at 1805-1880 MHZ, the first signal path that transmits at 1710-1785 MHz is concurrently connected to the antenna port AP of ASM along with the second signal path $SP_2$ that receives at 1805-1880 MHz. Therefore, a duplexer functionality of LTE band 3 is provided by a duplex filter 804a for LTE band 4 and a receive filter 804b of LTE band 3.

Figure 9:
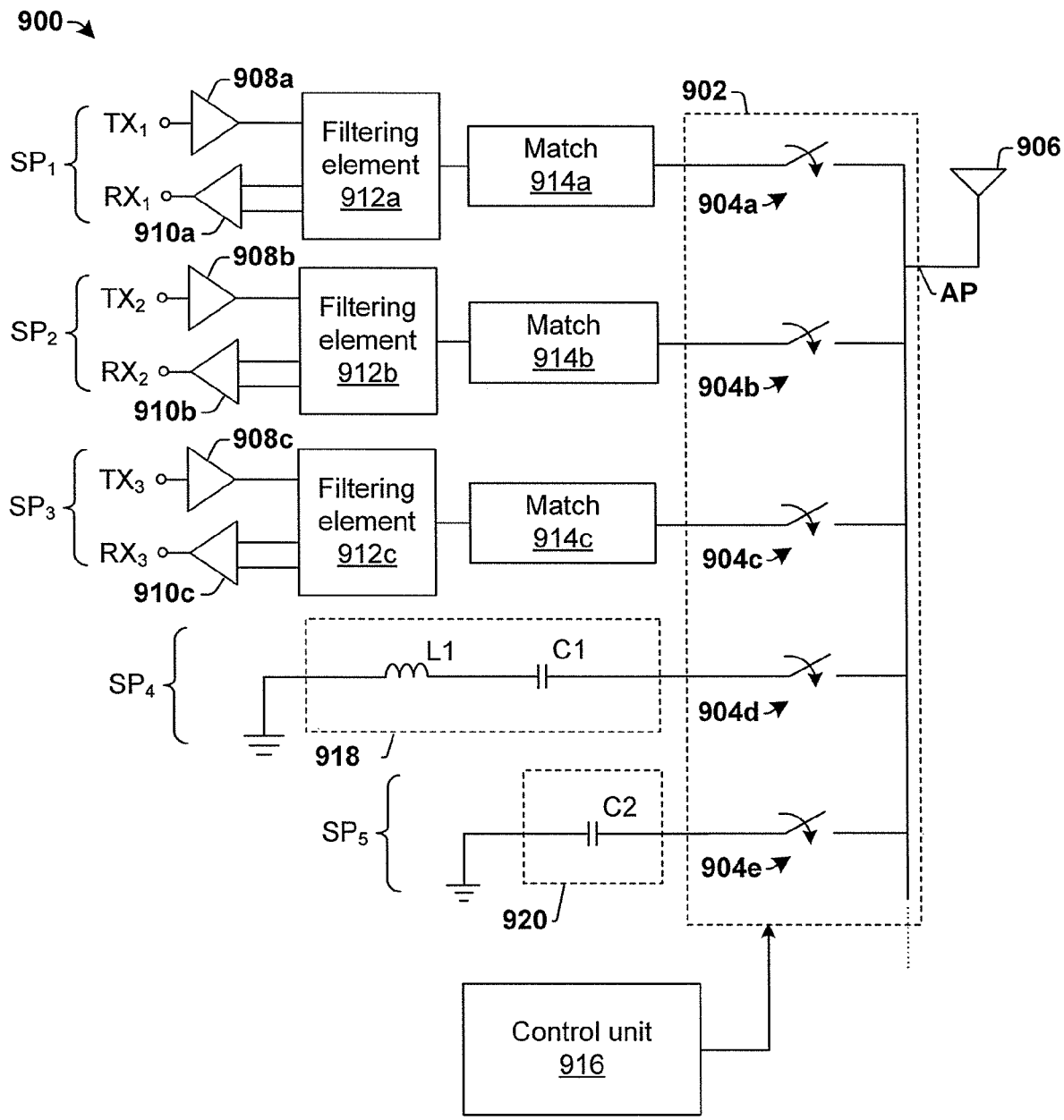
FIG. 9 illustrates a block diagram of another example of a disclosed transceiver system having additional signal paths that can be used to tune the matching networks.

FIG. 9 illustrates a block diagram of another example of a disclosed transceiver system 900 comprising signal paths configured to selectively improve the performance of the transceiver system 900.

Transceiver system 900 comprises a plurality of signal paths $SP_1$-$SP_5$. Signal paths $SP_1$-$SP_3$ respectively comprise a transmission chain $T_{Xn}$ (where n=1-3) and a reception chain $R_{Xn}$ connected to a filtering element 912m (where m=a-c).

Transceiver system 900 further comprises additional signal paths $SP_4$ and $SP_5$, which are configured to selectively improve the performance of the transceiver system 900. The additional signal paths $SP_4$ and $SP_5$ are connected to the ASM 902 in parallel with signal paths $SP_1$-$SP_3$, such that if the ASM connects the additional signal paths $SP_4$ and $SP_5$ to the antenna port AP, they are connected in parallel with other signal paths that are connected to the antenna port AP.

Signal path $SP_4$ comprises an additional filtering element 918 connected between a switching element 904d in ASM 902 and a ground terminal. The additional filtering element 918 may be connected to the antenna port AP to increase filtering of the transceiver system 900. The additional filtering element 918 may comprise a trap filter having a capacitor C1 and an inductor L1 connected in series. The trap filter suppresses harmonics or noise in a dedicated frequency band in the different signal paths. Alternatively, the additional filtering element 918 may comprise any other type of suitable circuitry.

Signal path $SP_5$ comprises a tuning element 920 connected between a switching element 904e in ASM 902 and a ground terminal. The tuning element 920 may be connected to the antenna port AP to tune the impedance of the system (e.g., to vary the phase shift of a matching network in another signal path). The tuning element may be used to fine tune the matching networks 914, so that fixed matching networks can be operated as variable matching networks. In some examples, the tuning element 920 may comprise a shunt inductor having a first terminal connected to switching element 904e and a second terminal connected to the ground terminal. Alternatively, the tuning element 920 may comprise a shunt capacitor C2 having a first terminal connected to switching element 904e and a second terminal connected to the ground terminal.

In cases, the control unit 916 is configured to selectively connect the additional filter element 918 and/or the tuning element 920, based upon one or more operating conditions of the transceiver system. For example, in mobile communication devices having cellular and Wi-Fi capabilities, the control unit 916 may be configured to close switching element 904d when the Wi-Fi is activated and open switching element 904d when Wi-Fi is not activated. By selectively connecting the one or more tuning/filtering elements, 918 and 920, the insertion loss and thus current consumption can be reduced when operation of the tuning/filtering elements is not beneficial.

Figure 10:
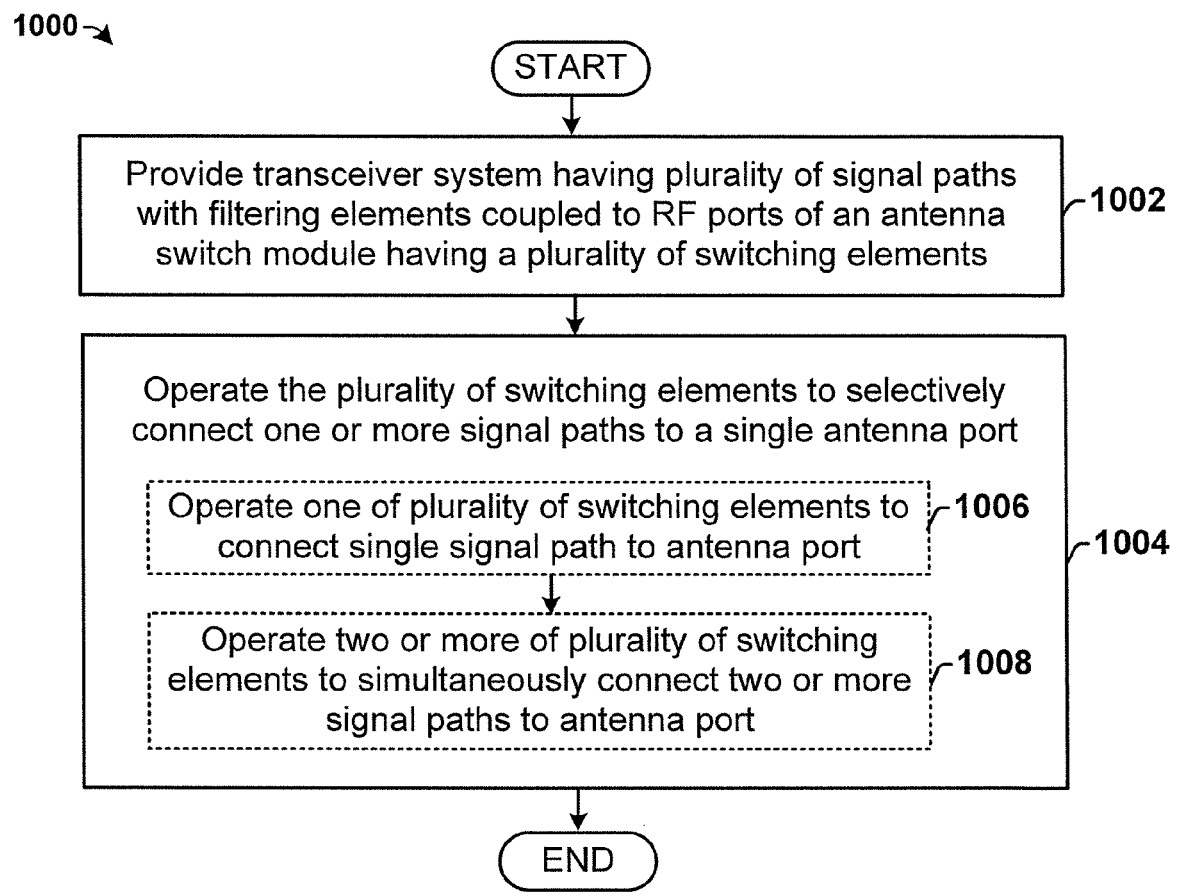
FIG. 10 is a flow diagram of an exemplary method to provide isolation through selective matching of filters in a plurality of signal paths that are configured to operate over a plurality of frequency bands

FIG. 10 is a flow diagram 1000 of an exemplary method to provide isolation through selective matching of filters in a plurality of signal paths that are configured to operate over a plurality of frequency bands.

While the disclosed method 1000 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects of the description herein. Further, one or more of the acts depicted herein may be carried out in one or more separate acts and/or phases At 1002, a transceiver system is provided having a plurality of signal paths coupled to RF ports of an antenna switch module (ASM) having a plurality of switching elements. Respective RF ports of the ASM are connected to a separate switching element, which are configured to selectively connect the RF port to an antenna port of the ASM. The plurality of signal paths comprise filtering elements having specific filtering responses. For example, a first path may comprise a filtering element having a first pass band and a first stop band, while a second path may comprise a filtering element having a second pass band and a second stop band.

At 1004, one or more of the plurality of switching elements are operated to connect one or more signal paths to the antenna port of the ASM. Connecting the one or more signal paths to the antenna port provides for a collective filtering response that is based upon a culmination of the filtering responses of the connected one or more signal paths.

In some examples, one of the plurality of switching elements may be operated to connect a single signal path to the antenna port at 1006. Since the single signal path has a filtering response that corresponds to a specific frequency band, connecting the single signal path to the antenna port of the ASM allows the transceiver system to operate in a single band mode of operation.

In other examples, two or more of the plurality of switching elements are operated to simultaneously connect two or more signal paths to the antenna port, at 1008. In some cases, wherein each of the two or more signal paths has a filtering response that corresponds to a specific frequency band, connecting two or more signal paths to the antenna port allows the transceiver system to operate in a carrier aggregation mode of operation. In other cases, wherein each of the two or more signal paths has a filtering response that corresponds to a multiple frequency bands, connecting two or more signal paths to the antenna port allows the transceiver system to operate transmit signals of a frequency band over a first signal path and to receive signals of the frequency band over a second signal path.

Although the disclosure has been shown and described with respect to one or more implementations, equivalent alterations and modifications will occur to others skilled in the art based upon a reading and understanding of this specification and the annexed drawings. Further, it will be appreciated that identifiers such as "first" and "second" do not imply any type of ordering or placement with respect to other elements; but rather "first" and "second" and other similar identifiers are just generic identifiers. In addition, it will be appreciated that the term "coupled" includes direct and indirect coupling. The disclosure includes all such modifications and alterations and is limited only by the scope of the following claims. In particular regard to the various functions performed by the above described components (e.g., elements and/or resources), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. In addition, the articles "a" and "an" as used in this application and the appended claims are to be construed to mean "one or more".

Furthermore, to the extent that the terms "includes", "having", "has", "with", or variants thereof are used in either the detailed description or the claims, such terms are intended to be inclusive in a manner similar to the term "comprising."

What is claimed is:

1. A transceiver system, comprising:
   a plurality of signal paths, a subset of the plurality of signal paths respectively comprising a filtering element, wherein the plurality of signal paths comprise a first signal path comprising a trap filter and a second signal path comprising a tuning element, wherein the trap filter comprises a first capacitor and a first inductor, and wherein the tuning element comprises one of a second capacitor or a second inductor;
   an antenna switching module (ASM) having a plurality of RF ports and a plurality of switching elements, wherein respective RF ports are connected to a separate switching element that is configured to selectively connect the RF port to an antenna port of the ASM; and
   a control unit configured to generate a plurality of control signals that operate the plurality of switching elements to selectively connect the plurality of signal paths to the antenna port, wherein a filtering response at the antenna port is equal to a combination of filtering responses of filtering elements within the connected signal paths, wherein the connected signal paths are connected in parallel with one another.

2. The transceiver system of claim 1, wherein one or more of the plurality of signal paths, comprise:
   a transmission chain having a power amplifier coupled to the filtering element, which comprises a duplex filter; and
   a reception chain having a low noise amplifier coupled to the duplex filter;
   wherein the duplex filter comprises a transmit filter having a first pass band at a first frequency range and a first stop band at a second frequency range and a receive filter having a second pass band at the second frequency range and a second stop band at the first frequency range.

3. The transceiver system of claim 2,
   wherein the ASM is configured to operate in a single band operating mode in which the ASM connects one of the plurality of signal paths to the antenna port; and
   wherein the ASM is configured to operate in a carrier aggregation operating mode in which the ASM simultaneously connects at least two of the plurality of signal paths to the antenna port.

4. The transceiver system of claim 1, wherein one or more of the plurality of signal paths, comprise:
   a transmission chain having a power amplifier coupled to the filtering element, which comprises a transmit filter having a first pass band at a first frequency range and a first stop band at a second frequency range; or
   a reception chain having a low noise amplifier coupled to the filtering element, which comprises a receive filter having a second pass band at the second frequency range and a second stop band at the first frequency range.

5. The transceiver system of claim 4, wherein the transmit filter or the receive filter comprise single filters.

6. The transceiver system of claim 1,
wherein a first one of the plurality of signal paths comprises a transmission chain having a transmit filter with a first pass band comprising a first frequency band and a second frequency band; and
wherein a second one of the plurality of signal paths comprises a reception chain having a receive filter with a second pass band comprising a third frequency band and the second frequency band.

7. The transceiver system of claim 1,
wherein a first one of the plurality of signal paths comprises a first filtering element comprising a duplex filter; and
wherein a second one of the plurality of signal paths comprises a second filtering element comprising a single filter.

8. The transceiver system of claim 1, wherein the trap filter is connected between the ASM and a ground terminal and configured to increase the filtering of the filtering element comprised within another one of the plurality of signal paths.

9. The transceiver system of claim 1, wherein the plurality of signal paths respectively comprise:
a matching network connected between the ASM and the filtering element and configured to change an impedance of combined signal paths as seen by the antenna port to minimize insertion loss.

10. The transceiver system of claim 9, wherein the matching network comprises a transmission line configured to introduce a phase shift.

11. The transceiver system of claim 1,
wherein the tuning element is connected between the ASM and a ground terminal and is configured to change the impedance of combined signal paths to optimize the insertion loss.

12. The transceiver system of claim 11, wherein the tuning element comprises a shunt capacitor having a first terminal connected to the ASM and a second terminal connected to a ground terminal.

13. A transceiver system, comprising:
an antenna switch module (ASM) comprising a plurality of switching elements configured to respectively connect a plurality of RF ports to an antenna port;
a transmission chain configured to provide a first signal having a first frequency to a first RF port of the plurality of RF ports;
a first filter located within the transmission chain and configured to have a first pass band at a first frequency range comprising the first frequency and a first stop band at a second frequency range;
a reception chain configured to receive a second signal having a second frequency from a second RF port of the plurality of RF ports;
a second filter located within the reception chain and configured to have a second pass band at the second frequency range comprising the second frequency and a second stop band at the first frequency range;
a trap filter comprising a first inductor and a first capacitor coupled to a third RF port of the plurality of RF ports;
a tuning element comprising one of a second capacitor or a second inductor coupled to a fourth RF port of the plurality of RF ports; and
a control unit configured to generate one or more control signals that operate the plurality of switching elements to connect the transmission chain and the reception chain to the antenna port and to selectively connect, in parallel, at least one of the trap filter or the tuning element to the antenna port to combine filtering responses of filters within the connected transmission chain and the connected reception chain to generate a collective filtering response.

14. The transceiver system of claim 13, further comprising:
a plurality of additional reception paths selectively connected to the antenna port by way of the ASM and respectively comprising an additional receive filtering element having a first additional stop band and a first additional pass band; and
a plurality of additional transmission paths selectively connected to the antenna port by way of the ASM and respectively comprising an additional transmit filtering element having a second additional stop band and second additional pass band.

15. The transceiver system of claim 14,
wherein the ASM is configured to operate in a single band operating mode in which the ASM connects one of the transmission paths and one of the reception paths to the antenna port; and
wherein the ASM is configured to operate in a carrier aggregation operating mode in which the ASM simultaneously connects at least two of the transmission paths or at least two of the reception paths to the antenna port.

16. The transceiver system of claim 14,
wherein the trap filter is connected between the ASM and a ground terminal and configured to increase the filtering of the transceiver system.

17. The transceiver system of claim 13, wherein the transmission and reception chains further comprise matching network located upstream of the ASM and configured to change an impedance of combined signal paths as seen by the antenna port to a value that minimizes insertion loss.

18. The transceiver system of claim 17,
wherein the tuning element is connected between the ASM and a ground terminal and is configured to change an impedance of the combined filtering responses as seen by the antenna port to minimize the insertion loss.

19. A method of matching filters in a transceiver system, comprising:
providing a transceiver system having a plurality of signal paths, a subset of the plurality of signal paths with filtering elements, wherein the plurality of signal paths are selectively connected to an antenna port by way of an antenna switch module (ASM) having separate switching elements associated with respective signal paths, wherein the plurality of signal paths comprise a first signal path comprising a trap filter and a second signal path comprising a tuning element, wherein the trap filter comprises a first capacitor and a first inductor, and wherein the tuning element comprises one of a second capacitor or a second inductor; and
generating, by a control unit, a plurality of control signals that operate one or more of the plurality of switching elements to selectively connect one or more signal to the antenna port, wherein connecting the signal paths to the antenna port combines filtering responses of filtering elements within the connected signal paths to generate a collective filtering response, wherein the connected signal paths are connected in parallel with one another.

20. The method of claim 19, further comprising:
operating, by the control unit, two or more of the plurality of switching elements to simultaneously connect two or more of the plurality of signal paths to the antenna port.

* * * * *